US009981758B2

(12) United States Patent
Judd et al.

(10) Patent No.: US 9,981,758 B2
(45) Date of Patent: May 29, 2018

(54) ADAPTABLE, MODULAR, MULTI-PURPOSE SPACE VEHICLE BACKPLANE

(71) Applicant: Los Alamos National Security, LLC, Los Alamos, NM (US)

(72) Inventors: Stephen Judd, Los Alamos, NM (US); Nicholas Dallmann, Los Alamos, NM (US); Kevin McCabe, Santa Fe, NM (US); Adam Warniment, Santa Fe, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 245 days.

(21) Appl. No.: 14/745,810

(22) Filed: Jun. 22, 2015

(65) Prior Publication Data

US 2015/0367967 A1    Dec. 24, 2015

Related U.S. Application Data

(60) Provisional application No. 62/016,552, filed on Jun. 24, 2014.

(51) Int. Cl.

| | |
|---|---|
| *H05K 1/14* | (2006.01) |
| *H05K 7/14* | (2006.01) |
| *B64G 1/42* | (2006.01) |
| *B64G 1/10* | (2006.01) |
| *B64G 1/66* | (2006.01) |

(52) U.S. Cl.
CPC ............. *B64G 1/428* (2013.01); *B64G 1/10* (2013.01); *H05K 1/14* (2013.01); *H05K 7/1439* (2013.01); *B64G 1/66* (2013.01); *B64G 2001/1092* (2013.01)

(58) Field of Classification Search
CPC ............ H05K 1/144; H05K 1/14; H05K 7/14; H05K 7/1435; H05K 7/1439; H05K 7/1477

See application file for complete search history.

(56) References Cited

U.S. PATENT DOCUMENTS

| | | | |
|---|---|---|---|
| 2006/0185277 A1* | 8/2006 | Quincieu ................. | B64G 1/10 52/265 |
| 2014/0039729 A1* | 2/2014 | Puig-Suari ............... | B64G 1/66 701/3 |

OTHER PUBLICATIONS

Space Micro MSS-01,02 Medium Sun Sensors Brochure, http://www.spacemicro.com/assets/datasheets/guidance-and-nav/MSS.pdf (May 2, 2014).
ESTCube-1 Wikipedia Page, https://en.wikipedia.org/wiki/ESTCube-1 (last accessed Apr. 24, 2014).

* cited by examiner

*Primary Examiner* — Robert J Hoffberg
*Assistant Examiner* — Hung Dang
(74) *Attorney, Agent, or Firm* — LeonardPatel P.C.; Michael Leonard; Sheetal Patel

(57) ABSTRACT

An adaptable, modular, multi-purpose (AMM) space vehicle backplane may accommodate boards and components for various missions. The AMM backplane may provide a common hardware interface and common board-to-board communications. Components, connectors, test points, and sensors may be embedded directly into the backplane to provide additional functionality, diagnostics, and system access. Other space vehicle sections may plug directly into the backplane.

15 Claims, 5 Drawing Sheets

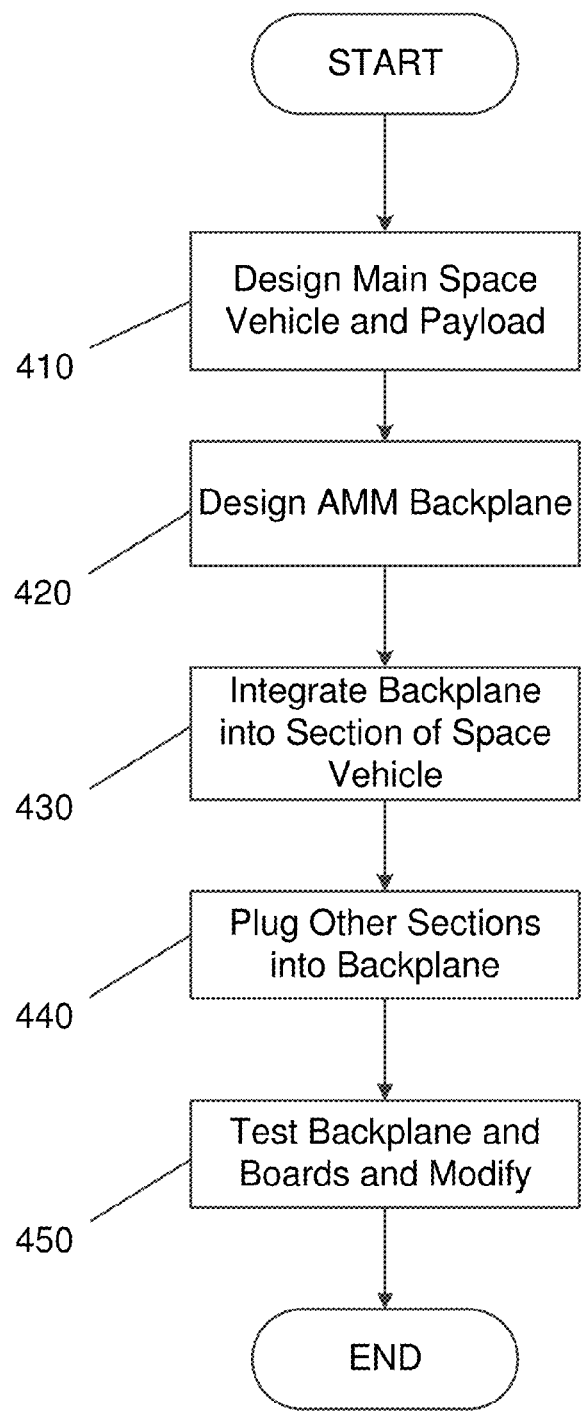

ADAPTABLE, MODULAR, MULTI-PURPOSE SPACE VEHICLE BACKPLANE

CROSS REFERENCE TO RELATED APPLICATION

This application claims the benefit of U.S. provisional patent application No. 62/016,552 filed on Jun. 24, 2014. The subject matter of this earlier filed application is hereby incorporated by reference in its entirety.

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD

The present invention generally relates to space vehicles, and more particularly, to an adaptable, modular, multi-purpose (AMM) space vehicle backplane where hardware components of the space vehicle commonly share the backplane.

BACKGROUND

In conventional space vehicles, circuit boards and components are custom developed by different providers for various applications pertinent to a given space vehicle mission. These boards and components are typically connected to one another using wiring harnesses, or the boards may be stacked on top of each other with interconnects therebetween. This custom development and lack of coherent integration increases cost and complexity.

Traditional backplanes, such as Peripheral Component Interconnect express (PCIe), are often used in conventional space vehicles to connect circuit boards together in a common hardware framework. Traditional backplane designs are feature-rich, designed to apply to a wide variety of problems, and as such, are fairly large and complex. For example, PCIe uses a total of 164 pins per connector, providing power, serial links, and a common reference clock to enable multiple boards to communicate with a common host. The large size makes traditional backplane designs difficult to use in micro-satellites and nano-satellites, such as cubesats, and the additional complexity greatly increases development time and adds features not necessary for the simpler needs of small space vehicles. Accordingly, an improved way to connect circuitry and components in space vehicles may be beneficial.

SUMMARY

Certain embodiments of the present invention may provide solutions to the problems and needs in the art that have not yet been fully identified, appreciated, or solved by conventional space vehicle backplanes. For example, some embodiments of the present invention pertain to an AMM space vehicle backplane that can be configured to accommodate component designs for various missions.

In an embodiment, an apparatus includes an AMM space vehicle backplane configured to route power, digital signals, analog signals, and radio frequency signals. The AMM space vehicle backplane is modular in that features can be added, changed, or removed, enabling an internal arrangement and a number and/or types of boards and components of a space vehicle to be readily changed as desired or needed.

In another embodiment, a space vehicle includes an AMM backplane and at least one section that does not contain the AMM backplane. The at least one section that does not contain the AMM backplane plugs directly into the AMM backplane.

In yet another embodiment, a space vehicle includes a top section including radio frequency (RF) components. The space vehicle also includes a middle section including an AMM backplane, and a bottom section including power components. The top section and the bottom section plug directly into the space vehicle backplane.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 4 is a flowchart illustrating a process for implementing an AMM backplane, according to an embodiment of the present invention.

DETAILED DESCRIPTION OF THE EMBODIMENTS

Figure 1:
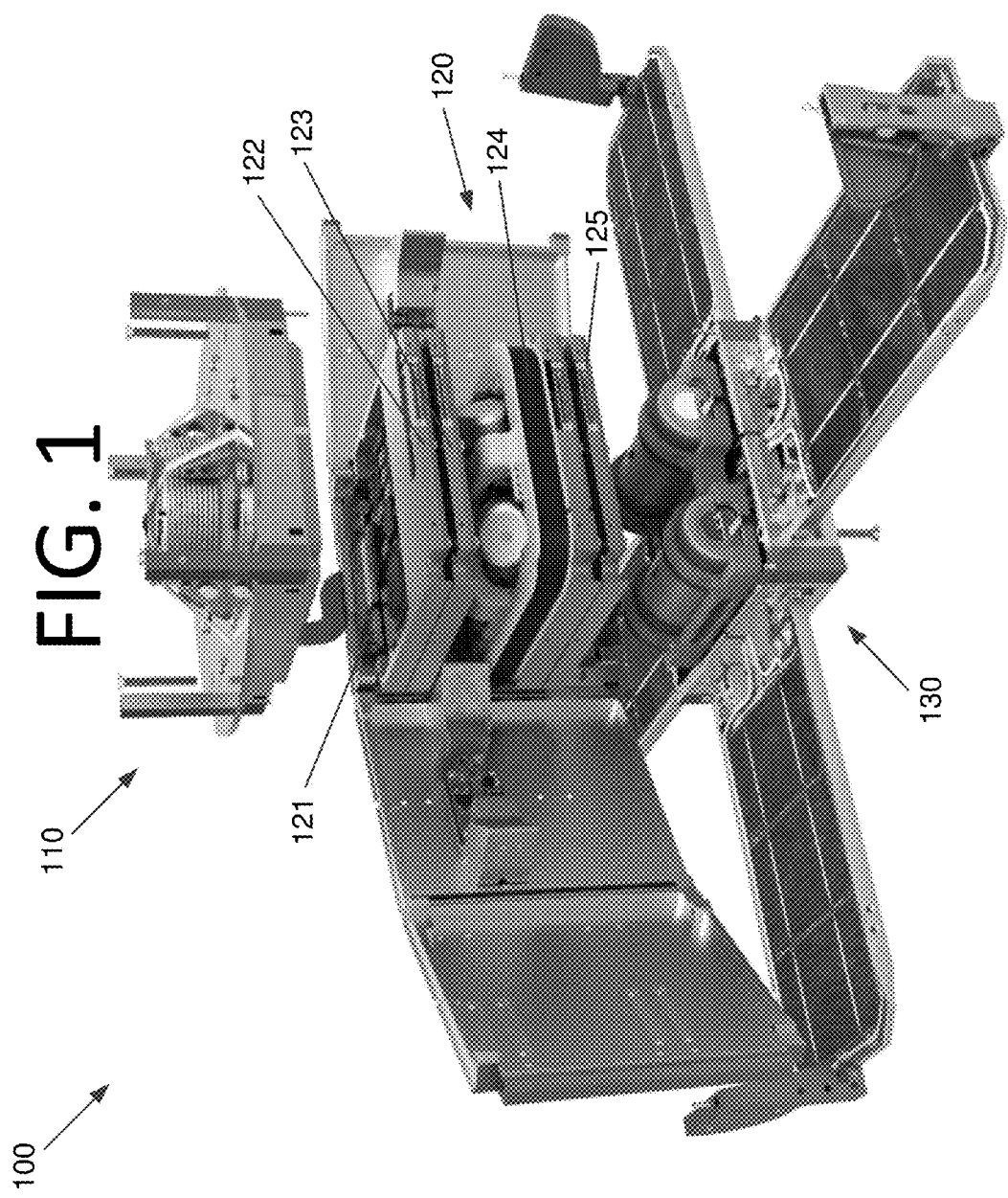
FIG. 1 is an exploded perspective view illustrating a cubesat with an opened chassis, according to an embodiment of the present invention.

Some embodiments of the present invention pertain to an AMM space vehicle backplane that can accommodate circuits, or components having circuits, for various missions. In some embodiments, the backplane may be adaptable in that the backplane can be adapted to different situations and needs of the space vehicle or payload. The backplane may be modular in that features can be added, changed, or removed as needed and support a modular space vehicle design consisting of multiple sections (i.e., modules)—for instance, a top section, a middle section, and a bottom section. The backplane may be multi-purpose in some embodiments in that the backplane can route different types of signals, including power, digital, and RF, support different serial and parallel communications protocols including SPI, I2C, CAN, RS-232, RS-422, and custom protocols, provide debug and test connectors, host cameras and other sensors used by the space vehicle, and support different space vehicle physical layouts.

In conventional backplanes, the predefined backplane standards force the space vehicle or payload design to conform to the backplane. For example, the PCIe standard is designed to allow multiple slave devices to communicate with a master host, whereas in many space vehicle and payload designs, it is desirable to allow boards to connect in other network topologies, and not be forced into a specific backplane design. Similarly, the predefined signals may not be desirable. For example, the PCIe standard provides provisions for power and data signals, but not radio frequency (RF). The PCIe standard provides many more data lines than are needed by a small space vehicle, such as a small cubesat, leading to much larger connectors than required, consuming volume and mass on the space vehicle. Similarly, many backplanes predefine specific communication protocols, whereas different protocols may be more appropriate for small space vehicles.

Accordingly, some embodiments provide a backplane that conforms to the space vehicle or payload design. After each component is complete, the component may be integrated into the backplane and tested. Such a design may facilitate easy assembly with high reliability. The backplane may be modified to accommodate different heights and board positions. The integrator may keep the parts of the backplane that are needed for a given mission and remove the others.

The AMM backplane of some embodiments provides a means of routing signals without using wiring harnesses. Doing so simplifies assembly and testing, as boards are simply plugged into the backplane and can be tested in-situ. This lowers costs for development, fabrication, and assembly, and greatly improves reliability compared to a wiring harness. The backplane design also enables high speed serial communications in a simpler configuration as compared to a custom wiring harness.

The AMM architecture provides the ability to adapt to different situations. Boards and components may be located at different positions in the space vehicle as needed. The space vehicle layout may be changed by changing the backplane, not redesigning the entire space vehicle. Different types of signals, including data, power, and RF, may be routed on the backplane. The AMM backplane architecture enables the backplane to be designed around the space vehicle and payload. Backplane signals, pin assignments, functions, and connector placements may be defined and modified after the space vehicle is designed, which is not possible with conventional backplanes. The AMM backplane architecture enables a common digital board architecture by providing a common hardware interface and common board-to-board communications.

The AMM architecture also enables the modular structure design, consisting of top, middle, and bottom sections, for example. However, any number and location of sections may be used without deviating from the scope of some embodiments. The backplane is in the middle section in some embodiments, while the top and bottom sections may plug directly into the backplane. The AMM architecture allows components, connectors, test points, and sensors to be embedded directly into the backplane to provide additional functionality, diagnostics, and system access as needed. Backplane components may be accessed by removal of an access panel on the side of the space vehicle.

FIG. 1 is an exploded perspective view illustrating a cubesat 100 with an opened chassis, according to an embodiment of the present invention. Cubesat 100 includes a top section 110 including RF components, a middle section 120 including circuitry, and a bottom section 130 including power components. A backplane 121 is located in middle section 120 in this embodiment, but may be in any desired location in other embodiments. Backplane 121 integrates with, and provides connections for, a high band digital radio 122 using a helical antenna, a low band digital radio 123 using a dipole antenna, an attitude determination and control system (ADCS) 124, and command and data handling (C&DH) 125. Backplane 121 may be of any desired size and fit within any desired space vehicle architecture. In this embodiment, top section 110 and bottom section 130 plug directly into backplane 121.

Figure 2:
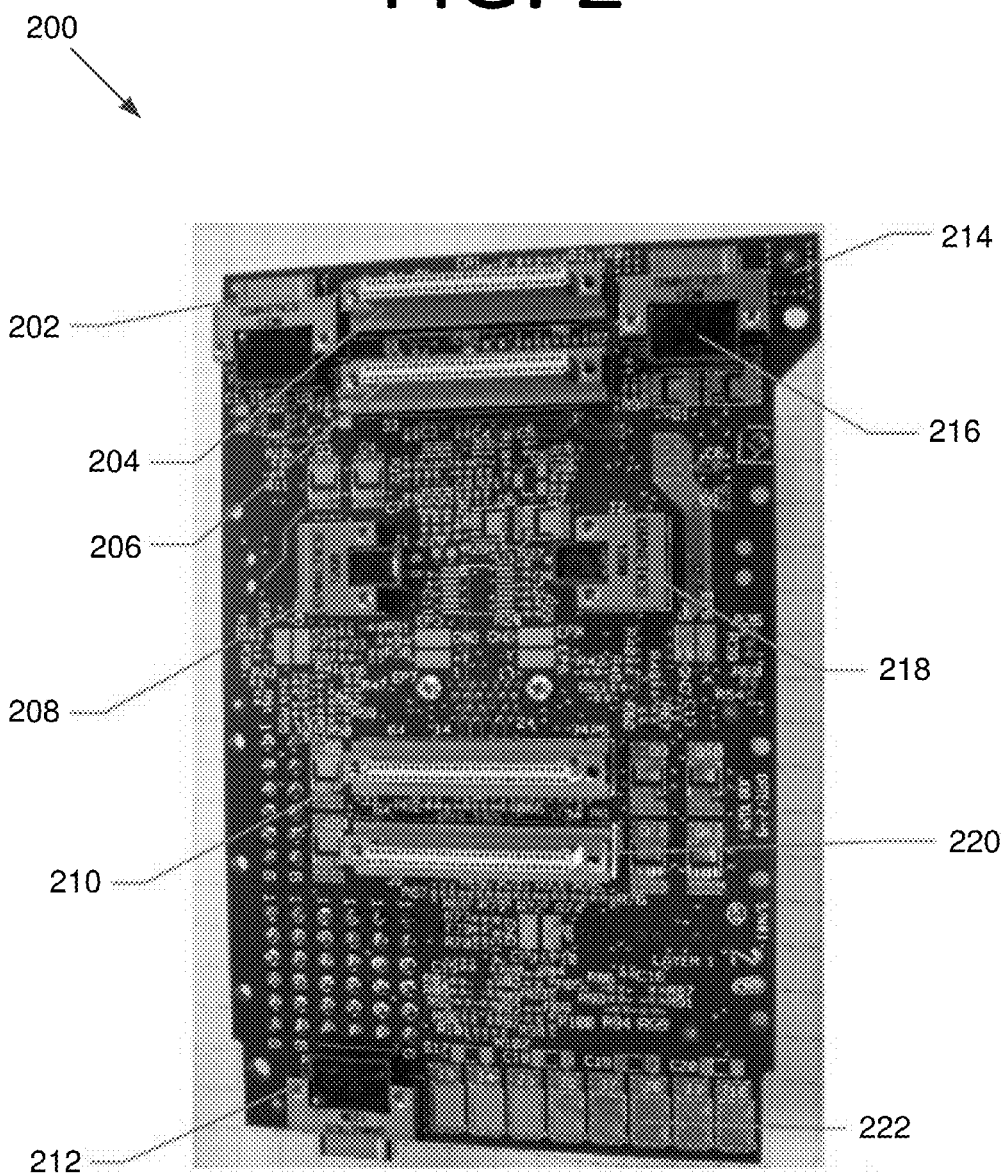
FIG. 2 is a top view illustrating a backplane, according to an embodiment of the present invention.

FIG. 2 is a top view illustrating a backplane 200, according to an embodiment of the present invention. The location of the various components of the backplane is a matter of design choice, depending on the given space vehicle design, capabilities, and mission requirements. Per the above, backplane 200 may be designed for, and conform to, the design of the space vehicle and payload, and not vice versa.

Backplane 200 includes a high band connection 202 and a low band connection 216 to an analog radio board to receive data from helical and dipole antennas, respectively. A high band radio digital connector 204 and a low band radio digital connector 206 connect to a high band digital radio printed circuit board (PCB) and a low band digital radio PCB, respectively. A +X sun sensor connector 208 and a −X sun sensor connector 218 connect backplane 200 to two sun angle sensors for those respective axis components.

An ADCS connector 210 and a C&DH connector 220 provide connectivity for ADCS and C&DH boards, respectively. A power board sense and digital connector 212 and main power rails 222 provide connectivity to a power board for data and power, respectively. The components of FIG. 2 may be in any position and/or orientation in some embodiments. Also, in certain embodiments, some of these components may not be present. For instance, for certain smaller and more cost-effective cubesat designs, the ADCS, high data rate communication, and/or certain other hardware and functionality may not be present. Additional ports and connectors are also possible as a matter of design choice. Thus, it is possible to move boards to different places or account for different heights by quick modifications to the backplane. In some embodiments, software, hardware, and design are all integrated.

Figure 3A:
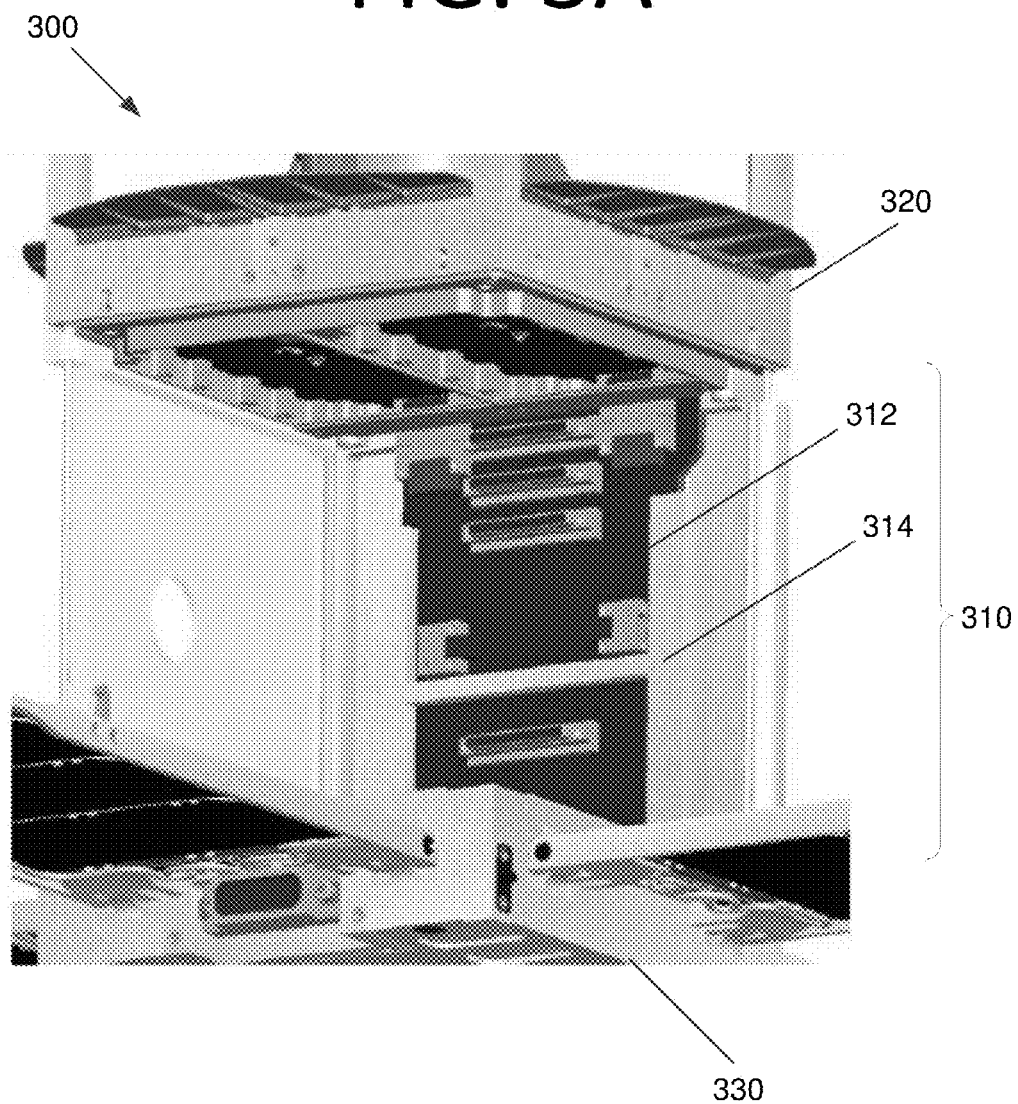
FIG. 3A is a perspective view from a lower position illustrating a space vehicle with an open payload section, according to an embodiment of the present invention.
Figure 3B:
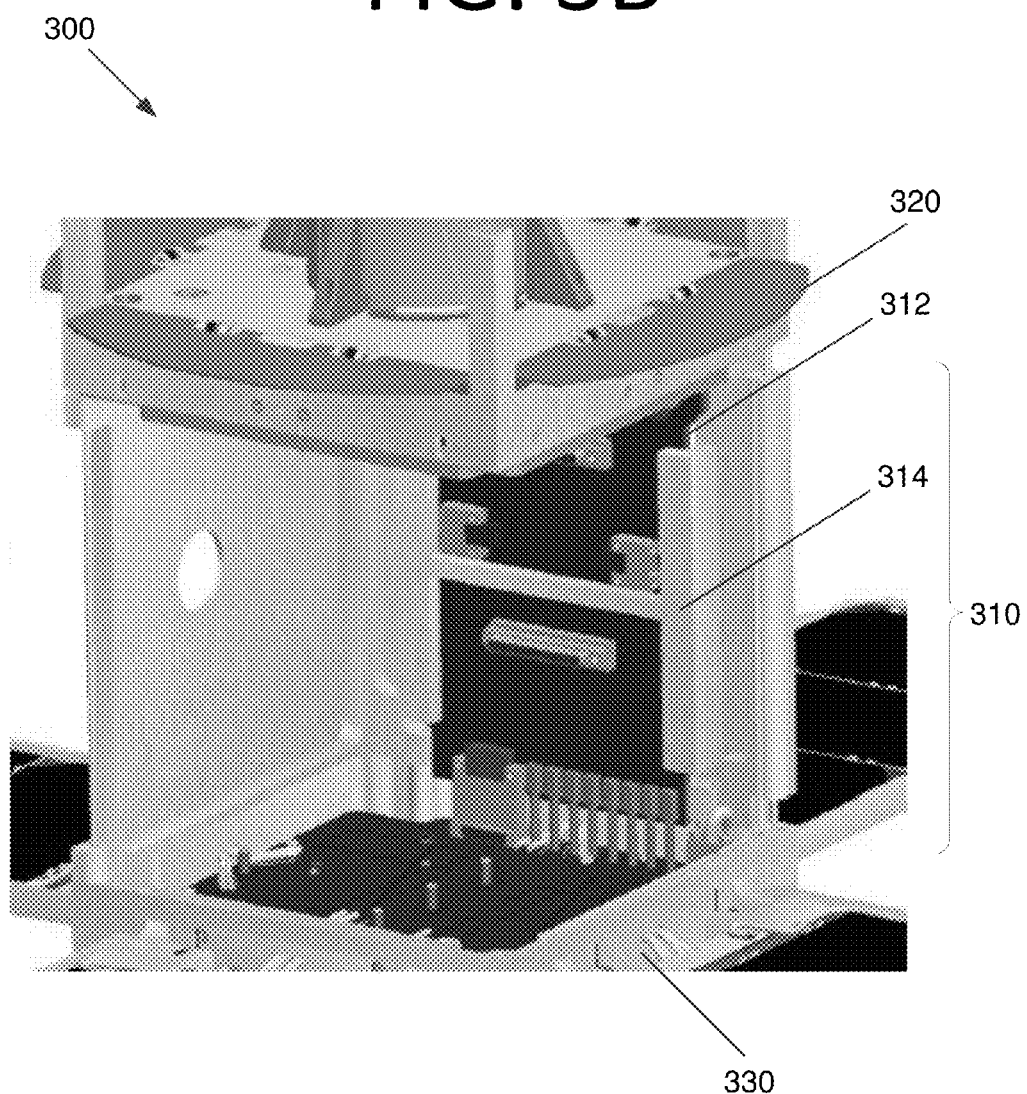
FIG. 3B is a perspective view from an upper position illustrating the space vehicle with an open payload section, according to an embodiment of the present invention.

An illustration of such a backplane mounted in a space vehicle can be seen in space vehicle 300 of FIGS. 3A and 3B. A payload module 310 contains a backplane 312, which is attached to a frame 314. Connectors on top of backplane 312 connect to an antenna and RF module 320. Connectors and power rails on the bottom of backplane 312 connect to a power module 330. In some embodiments, an access hatch (not shown) on the back of payload module 310 may allow for easy probing access to backplane 312.

Per then above, conventional backplanes standardize each pin in a connector. This forces the implementer to attempt to think of every single pin that may be needed for various components. However, some embodiments allow the component developer to decide what pin should carry what data based on the space vehicle and payload design. To accommodate this, connectors may have a relatively large number of pins (e.g., 128 pins), and component developers may elect to only use a subset of the pins. Furthermore, some pins are point-to-point and some pins bus throughout the entire backplane in some embodiments. For instance, a pin could be redefined to be an unanticipated trigger or interrupt if it is discovered during testing that such functionality is needed. As such, while the backplane architecture may be standardized in some embodiments, flexibility is provided to implement individual pins and features.

Various advantages may be realized though such a backplane design that conventional backplanes are not capable of. For instance, some embodiments enable signal routing without use of wiring harnesses. This simplifies assembly and testing, lowers costs, greatly improves reliability, and enables high speed serial communications. Some embodiments also enable a common digital board architecture by providing a common hardware interface and board-to-board communications. Per the above, a significant advantage of some embodiments is the ability to design the backplane around space vehicle and/or payload requirements, not vice versa. For instance, backplane signals, pins, and connector placements may be designed after the main space vehicle rather than before.

Some embodiments also provide the ability to adapt to different situations. Flexibility to mount boards and/or components in different locations within the space vehicle, the ability to change space vehicle layout without redesigning the space vehicle (i.e., only change the backplane, not the space vehicle), the ability to route different kinds of signals, including data, power, and RF, and the ability to redefine connector pins and functions as needed during development may be provided in some embodiments.

Modular space vehicle design (e.g., a top section, a middle section, and a bottom section) may be realized. For instance, the backplane may be in the middle section, allowing the top and bottom sections to plug into the backplane. Different sections may be removed as desired for testing or repair without disturbing the rest of the space vehicle. Components may be placed directly on the backplane, including sensors, cameras, diagnostics, and other components. In some embodiments, the backplane may be readily accessed via removal of a panel on the space vehicle. This provides a way to communicate with boards without disassembling the space vehicle. Connectors and test points may be placed directly on the backplane in some embodiments.

FIG. 4 is a flowchart illustrating a process for implementing an AMM backplane, according to an embodiment of the present invention. The process begins with designing a main space vehicle and payload at 410. Next, an AMM backplane is designed based on the main space vehicle and/or payload at 420.

The AMM backplane is integrated into a section of the space vehicle at 430. In some embodiments, the backplane may be accessible via a panel of the space vehicle, for example. The other sections of the space vehicle are then plugged into the backplane at 440, such that all components and boards are connected to the backplane.

The backplane and space vehicle boards and components are then tested at 450. As needed, pins may be added, removed, or reassigned. The backplane itself can also be redesigned and reintegrated into the space vehicle as needed.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
a first separable section of a space vehicle, comprising:
an adaptable, modular, multi-purpose (AMM) space vehicle backplane located in the first separable section of a space vehicle, the AMM space vehicle backplane configured to route power, digital signals, analog signals, and radio frequency signals, and
a set of panels surrounding a periphery of the first separable section,
a second separable section of the space vehicle comprising radio frequency (RF) components, and
a third separable section of the space vehicle comprising power components, wherein
the second separable section and the third separable section plug directly into the AMM space vehicle backplane from opposing sides of the first separable section that are not surrounded by the set of panels.

2. The apparatus of claim 1, wherein the AMM space vehicle backplane is configured to support different space vehicle section heights and board locations.

3. The apparatus of claim 1, wherein the AMM space vehicle backplane comprises debug and test connectors.

4. The apparatus of claim 1, wherein the AMM space vehicle backplane is configured to support different serial and parallel communications protocols.

5. The apparatus of claim 1, wherein the AMM space vehicle backplane hosts a camera, a sensor, or both, that are used by the space vehicle.

6. The apparatus of claim 1, wherein the AMM space vehicle backplane is configured to support different space vehicle layouts without making changes to the space vehicle.

7. The apparatus of claim 1, wherein the AMM space vehicle backplane is configured to route signals without a wiring harness.

8. The apparatus of claim 1, wherein after each space vehicle component is complete, and after the space vehicle has been designed, the respective component is configured to be plugged into the AMM space vehicle backplane and tested.

9. The apparatus of claim 1, wherein components, connectors, test points, and sensors are embedded directly into the AMM space vehicle backplane to provide additional functionality, diagnostics, and system access.

10. The apparatus of claim 1, wherein the AMM space vehicle backplane is accessed by removal of an access panel of the set of panels on a side of the space vehicle.

11. A space vehicle, comprising:
a separable middle section comprising an adaptable, modular, multi-purpose (AMM) backplane, the separable middle section housing circuits;
a separable top section comprising radio frequency (RF) components; and
a separable bottom section comprising power components, wherein
the separable top section and the separable bottom section do not contain the AMM backplane.

12. The space vehicle of claim 11, wherein components, connectors, test points, and sensors are embedded directly into the AMM backplane to provide additional functionality, diagnostics, and system access.

13. The space vehicle of claim 11, wherein the AMM backplane is modular in the sense that the AMM backplane conforms to a design of the space vehicle or a payload.

14. A space vehicle, comprising:
a separable top section comprising radio frequency (RF) components;
a separable middle section comprising an adaptable, modular, multi-purpose (AMM) backplane, the AMM backplane comprising first connectors, second connectors, and power rails; and
a separable bottom section comprising power components, wherein
the separable top section and the separable bottom section plug directly into the AMM backplane,
the first connectors of the AMM backplane connect to the separable top section of the space vehicle, and
the second connectors and the power rails of the AMM backplane connect to the separable bottom section of the space vehicle.

15. The apparatus of claim 14, wherein components, other connectors, test points, and sensors are embedded directly into the AMM backplane to provide additional functionality, diagnostics, and system access.

\* \* \* \* \*